United States Patent [19]

Edgar

[11] 4,050,023
[45] Sept. 20, 1977

[54] GENERAL PURPOSE POLE-ZERO SINGLE AMPLIFIER ACTIVE FILTER

[76] Inventor: Albert D. Edgar, 3217 Rock Hollow Road, Oklahoma City, Okla. 73120

[21] Appl. No.: 672,038

[22] Filed: Mar. 30, 1976

[51] Int. Cl.$^2$ .............................................. H03B 1/00
[52] U.S. Cl. .................................. 328/127; 330/107; 333/70 R; 307/229
[58] Field of Search ........ 328/167; 333/70 R, 70 CR, 333/80; 330/103, 107, 69; 307/229, 109

[56] References Cited

U.S. PATENT DOCUMENTS

| | | | |
|---|---|---|---|
| 3,530,395 | 9/1970 | Prusha | 330/69 |
| 3,609,567 | 9/1971 | Webb | 328/167 |
| 3,904,978 | 9/1975 | Daniels et al. | 328/167 X |
| 3,919,658 | 11/1975 | Friend | 330/69 |

Primary Examiner—Stanley D. Miller, Jr.
Assistant Examiner—B. P. Davis
Attorney, Agent, or Firm—Robert M. Hessin

[57] ABSTRACT

The active filter circuit form of this invention is capable of realizing any general order linear transfer function, as for example, an all pass time delay or an elliptic function. There is no inductive element and only one operational amplifier which is directly output, eliminating problems with internal volume scaling or output impedance matching. A specific example realizes a single amplifier all pass delay with 8 complex roots.

11 Claims, 8 Drawing Figures

GENERAL PURPOSE POLE-ZERO SINGLE AMPLIFIER ACTIVE FILTER

BACKGROUND OF THE INVENTION

1. Field of the Invention

The invention relates generally to linear filter circuits and, more particularly, but not by way of limitation, it relates to improvements in active RC filter circuitry, delay networks, cascaded filter network.

2. Description of the Prior Art

It is well known that any linear function may be expressed as the ratio of two power series in terms of the Laplace operator s. If the function is rational, the numerator and denominator series are fractorable into the products of terms with real roots, $(s + \beta)$. or into terms with complex or imaginary roots, $(s^2\ 2S+\beta)$. It is then never necessary to use higher than the second order in the operator s as a sum, since higher order terms may be formed by multiplying, or cascading, second order terms. Because of this mathematical property, networks realizing second order functions are extremely useful as building blocks to obtain an arbitrary transfer response. A number of networks have been devised to obtain specific second order functions, many of which now in general use, were introduced in the article "Active RC Synthesis" by Sallen and Key as published in 1955 by the Professional Group of Circuit Theory, now the proceedings of the IEEE. The addition of a loading element to one of the circuits of that article resulted in the well-known filter of Kerwin and Huelsman, U.S. Pat. No. 3,609,567, as issued on Sept. 28, 1971, which teaches the realization of complex zeros on the $j\ \omega$ axis as well as the provision of independently positioned complex poles.

There is a very important but difficult function class with left-half plane poles mirrored symmetrically by right-half plane zeros, called an all pass delay, which affects the phase of a signal as a function of frequency without affecting the magnitude. Such a function is used to provide a time delay, a phase equalizer, and is used in the realization of a Hilbert function. In the prior art it has been common to use expensive inductors or a multitude of active elements in the generation of such functions. U.S. Pat. No. 3,736,517 in the name of J.T. Lim presents an inductorless active filter for the all pass time delay function. Although it requires several times the number of active components of the present invention, this patent must be considered prior art with respect to the present teachings. Yet another U.S. Pat. No. 3,919,658 in the name of J. J. Friend represents the best prior art known to Applicant which is directed to a realization of a second order all pass time delay function through utilization of a hybride form of resistance and capacitance interconnection.

In contrast to the multiplicity of special purpose circuits which are present in the prior art, some such as the more wellknown all pass delay circuits being quite complex, the present invention offers a simple standard form that is capable of being connected to realize any order of rational function, either by cascading second order sections of itself for optimum stability, or as used directly as one network with only a single active element to enable optimum economy.

Therefore, it is an object of the present invention to provide a universal, inductorless, single operational amplifier filter network form which is capable of directly realizing any arbitrary theoretically realizable linear transfer function.

It is a further object of the invention to provide a universal building block single operational amplifier active filter, which because of arbitrary second order pole-zero realization capability, essentially zero output impedance, and controlled gain, may be directly cascaded to realize any theoretically realizable linear transfer function.

Finally, it is an object of the present invention to provide an inductorless all pass delay network which requires only one operational amplifier for the realization of an arbitrary number of roots.

Other objects and advantages of the invention will be evident from the following detailed description when read in conjunction with the accompanying drawings which illustrate the invention.

DETAILED DESCRIPTION OF THE INVENTION

Figure 1:
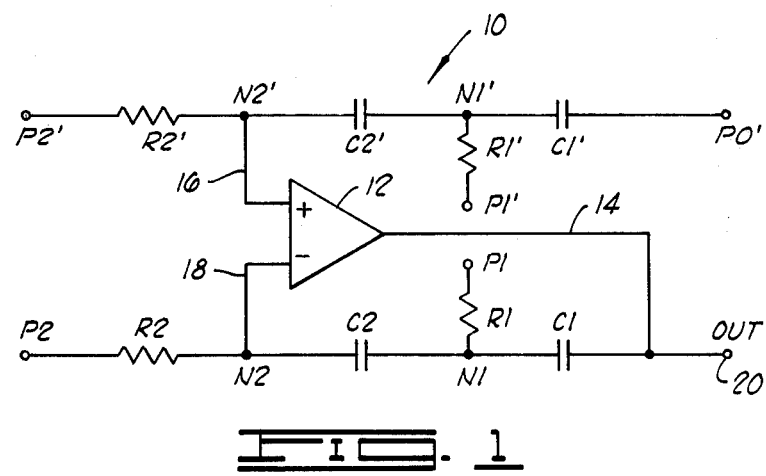
FIG. 1 illustrates schematically the two stage general form of the invention in which plural input ports are to be connected to a signal input, the operational amplifier output, or ground, subject to the second order transfer function to be realized.

The general second order form of the circuit is illustrated in FIG. 1 wherein specific transfer functions may be obtained for each of the different input ports of the network 10. A conventional integrated circuit operational amplifier 12, which may be of various well-known types, is interconnected to the multi-ported R-C port networks (primed and unprimed) by means of output lead 14, and positive and negative input leads 16 and 18. Note, NUMERICAL DESIGNATORS are used to identify structure in the networks in order to provide better correlation with derivation equations and later terminology.

In the network of FIG. 1 there are five input ports which are labeled PO', P1, P1', P2 and P2', each of which has some effect on the output, at terminal 20. The isolated effect of each can be examined by grounding to zero volts all but one input port which is being examined, and thereafter deriving the results. In such derivations, the following relationship will hold:

$$\frac{R1}{R1'} = \frac{R2}{R2'} = \frac{C1'}{C1} = \frac{C2'}{C2} = 1 \tag{1}$$

Depending upon context, each reference label may refer to a physical location or element, or to its associated voltage or impedance. The operational amplifier, hereinafter referred to as op-amp, is assumed to have infinite gain and input impedance, and all capacitors are assumed initially discharged.

First the effect from PO' is found. Assuming stability, the op-amp output is such that both input voltages to the op-amp are equal, or else the output would immediately change to correct the situation. It may be derived through symmetry that equality of inputs is possible only if $$\text{OUT} = \text{PO}' \tag{2}$$

i.e., in the absence of modifying transients and with all other input ports grounded.

In a next case, the effect from port P1 is derived. With PO', P1' and P2' grounded, the plus input 16 to op-amp 12 is zero, and therefore the minus input 18 must also be zero. No current will flow through R2, so none flows in C2, and the node N1 is also at zero voltage. The current in R1 is thus P1/R1, and the current in C1 is identically this. The voltage across C1, which is (0-OUT) which equals the negative of the voltage appearing at out terminal 20, is then the integral of this current and is given by $$\text{OUT} = \frac{1}{R1 \cdot C1} \int P1 dt \tag{3}$$

If an identical signal is applied to P1 and P1' simultaneously; then by symmetry, the op-amp inputs 6 and 18 remain equal if out equals PO'. But in this case the P0' port is zero. Thus P1 and P1' cancel each other's effect, and the same equation describing P1' as for P1 is indicated except for a sign change whereby the relationship is as follows:

$$\text{OUT} = + \frac{1}{R1' \cdot C1'} \int P1' dt \tag{4}$$

With a voltage at port P2 only, node N2 and thus also N2' will remain at zero potential. A current of P2/R2 flows through R2, and thus also through C2 if the input impedance of the op-amp is infinite. Because of the current in C2 and the zero voltage at N2 the voltage at N1 must be $$-\frac{1}{R2 \cdot C2} \int P2 dt \tag{5}$$

Because P1 is now zero, the current through R1 is $-N1/R1$ which equals $$\frac{1}{R1 \cdot R2 \cdot C2} \int P2 dt \tag{6}$$

and the total current through C1 is therefore $$\frac{P2}{R2} + \frac{1}{R1 \cdot R2 \cdot C2} \int P2 dt \tag{7}$$

The output voltage then must be $$-1/C1 = (\text{current in C1})dt + (\text{voltage at node N1}) \tag{8}$$

which may be expressed as $$\text{OUT} = - \left[ \left( \frac{1}{R2 \cdot C1} + \frac{1}{R2 \cdot C2} \right) \int P2 dt + \frac{1}{R1 \cdot R2 \cdot C1 \cdot C2} \int\int P2 dt^2 \right] \tag{9}$$

Yet a further relationship is demonstrated by applying the same signal to input ports P2 and P2'. The differential inputs to the op-amp 12 remain equal if out equals PO', but PO' is equal to zero. Therefore, input ports P2 and P2' will cancel each other's effect, and hence the OUT equation for node P2' will be the negative of the relation for node P2 in equation (9), hereafter referred to as "9-inverted".

For arbitrary component values not satisfying the initially assumed equality between primed and unprimed values, the transfer equations are found as follows: Equations 3 and 9 remain valid as they are. Equations 2, 4 and 9-transformed are then inverted by substituting PO", P1" and P2" for, respectively, PO', P1' and P2' where Equation 10

$$\frac{PO''}{PO'} = \frac{P1''}{P1'} = \frac{P2''}{P2'} = \frac{s^2 + \left( \frac{1}{R1 \cdot C1} + \frac{1}{R2 \cdot C1} + \frac{1}{R2 \cdot C2} \right)s + \frac{1}{R1 \cdot R2 \cdot C1 \cdot C2}}{s^2 + \left( \frac{1}{R1' \cdot C1'} + \frac{1}{R2' \cdot C2'} + \frac{1}{R2' \cdot C2'} \right)s + \frac{1}{R1' \cdot R2' \cdot C1' \cdot C2'}}$$

When all of the primed and unprimed component pairs are equal, this transfer function is obviously unity. It is also unity if R1/R1' equals R2/R' equals C1'/C1 equals C2'C2 equals K where K is an arbitrary constant. In many applications the optimum ratio between op-amp loading and impedance presented to the op-amp input occurs when K is about 1.8.

Figures 2A, 2B, 4:
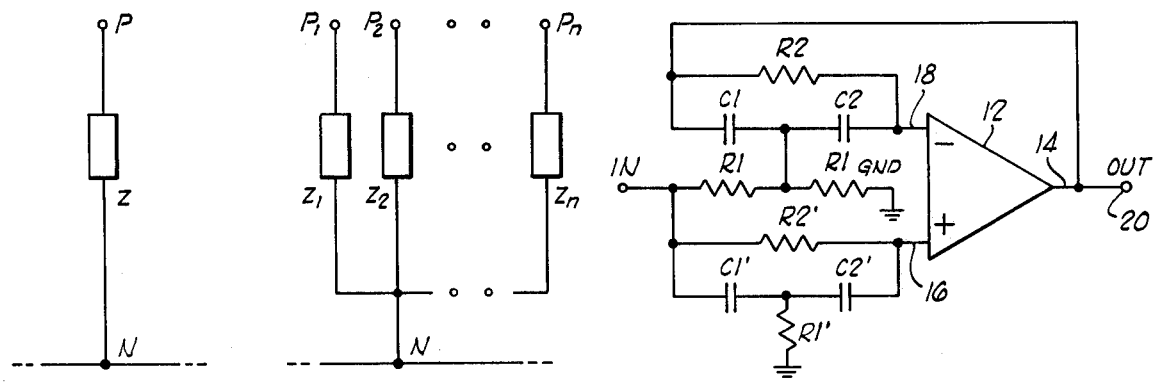
FIG. 2A and 2B illustrates an equivalent circuit depicting a constant impedance attenuation or Thevenin's equivalent which may replace any input port impedance in the circuit forms of the present invention.
FIG. 4 is a schematic diagram wherein an equivalent circuit as shown in FIG. 2 is applied to a specified element of FIG. 3 in order to realize an arbitrary Q all pass delay and other functions.

Referring now to FIGS. 2A and 2B, let node N be connected through an impedance Z to a source S at port P which is a linear combination of n other sources such that source S equals $K_1 S_1 + K_2 S_2 + - - - + K_n S_n$; $K_1 + K_2 + - - - + K = 1$; and for every $1 \leq m \leq n$, every $K_m$ is greater than or equal to zero; and, any $S_m$ may be zero. The impedance Z may then be split as illustrated in FIG. 2B, and each branch $Z_m$ is connected directly to a source $S_m$ through port $P_m$, and there will be no change in effect at node N if total parallel impedance relationships are adhered to in accordance with the Thevenin equivalence. Such impedance splitting allows the effective input of a linear combination of several signals to each port in the circuit of FIG. 1. The equivalents as illustrated in FIG. 2 may replace R1, R1′, R2, R2′, C1, or C2′ of FIG. 1 thereby to allow a combination of sources to be input at each port.

Considering now the universal building block or second order function in the Laplacian operator s, a relationship which is expressed as $$\frac{OUT}{IN} = \frac{\gamma s^2 + \alpha' s + \beta'}{s^2 + \alpha s + \beta} \tag{11}$$

and from this function there is obtained:

$$OUT = \gamma \cdot IN + \alpha' \int IN dt - \alpha \int OUT dt + \beta' \int\int IN dt^2 - \beta \int\int OUT dt^2 \tag{12}$$

The circuit in FIG. 1 has previously been capable of operating on signals to produce a constant gain, an integral, a negative integral, and also a difficult double integral and negative double integral. It is this ability to realize a complete set of integrals with either sign that allows the circuit form of FIG. 1 to realize any arbitrary second order transfer function by connecting the input ports to appropriate linear combinations of IN, OUT and ground.

The design procedure for obtaining the response of Equation 12 from the circuit form in FIG. 1 is as follows: First, the highest order double integral terms of Equation 12 are realized by connecting ports P2 and P2′ of FIG. 1 to IN, OUT or ground, or the appropriate linear combination of these using the equivalents illustrated in FIG. 2, such that when these inputs at ports P2 and P2′ are acted on by Equations 9 and 9-inverted, the constants $\beta$ or $\beta'$ in Equation 12 are realized. The next lower order single integral term of Equation 12 is then realized by inputting IN, OUT, or ground, or a linear combination of these, to the inverting and noninverting ports P1 and P1′ such that when these inputs are acted on by the complementary sign single integral Equations 3 and 4; and, the residual single integral effects of the double integral realization found in Equations 9 and 9-inverted are included then the $\alpha$ and $\alpha'$ constants in Equation 12 result. Finally, the non-integral term in Equation 12 is realized by an input to port P0′.

Figure 3:
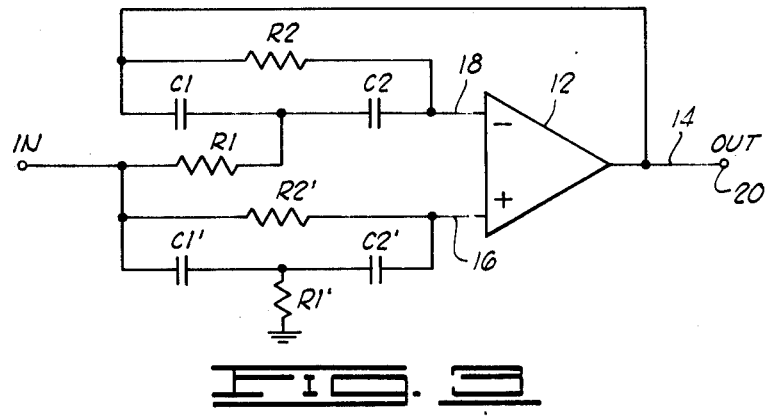
FIG. 3 is a schematic diagram wherein input ports of the FIG. 1 circuit form are connected to realize a low to medium Q all pass delay network, notch filter and other functions.

As a specific example using the circuit form of FIG. 1, ports P0′, P1, and P2′ are connected to IN, with port P2 connected to OUT, and port P1′ grounded to obtain the circuit shown in FIG. 3. By choosing appropriate components values, low Q functions of the form in Equation 13 are realizable with this circuit.

$$OUT = \frac{s^2 - \alpha' + \beta}{s^2 + \alpha + \beta} \tag{13}$$

The following design formulae are obtained from the Equations already presented. R1 was chosen as the arbitrary component because for unity, K, R1 is the approximate average loading impedance as seen by the signal input and op-amp output. The constants and components are with reference to FIG. 3 and Equation 13, except the constant value K which is an arbitrary constant that is usually unity. The following values apply:

$R1'K = R1 = $ arbitrary $C1'/K = C1 = \dfrac{1}{(\alpha + \alpha') \cdot R1}$ $C2'/K = C2 = \dfrac{\alpha}{\beta \cdot R1} - C1$ $R2'K = R2 = \dfrac{1/C1 + 1/C2}{\alpha}$ Two difficult functions of particular interest result when $\alpha$ equals $\alpha'$ for an all pass delay element, and when $\alpha'$ equals zero for a notch filter.

For the situation where $\alpha$ equals $\alpha'$, the circuit of FIG. 3 is capable of realizing functions for which the absolute value of the imaginary part of the roots divided by the real component of the roots are less than the square root of seven. For arbitrary Q, R1, as shown in FIGS. 1 and 3, may be split as illustrated in FIG. 2B between IN and ground to give the specific circuit shown in FIG. 4. For the case $\alpha$ equals $\alpha'$ and the absolute value of the imaginary part of the roots divided by the real component of the roots is greater than or equal to the square root of three, the extra degree of freedom allows both capacitors to be arbitrarily set equal. The design equations as set forth below refer to the circuit diagram of FIG. 4, adhered to Equation 13, and use K as an arbitrary constant (R1) and (G) are intermediate variables.

$R1'K = (R1) = $ arbitrary $C1'/K = C2'/K = C1 = C2 = \dfrac{\alpha}{2 \cdot \beta \cdot (R1)}$ $(G) = \dfrac{\alpha(\alpha + \alpha')}{2\beta}$ $R2'K = R2 = \dfrac{2}{\alpha \cdot C1}$ $R1_{in} = \dfrac{(R1)}{(G)}$ $R1_{gnd} = \dfrac{(R1)}{1 - (G)}$ As can be seen from the general discussion above, the two specific circuits represented in FIGS. 3 and 4 are samples, and not limits, of the use of the circuit form of FIG. 1. For example the averaging function $$\frac{\alpha' s + \beta}{s^2 + \alpha s + \beta} \tag{14}$$

is obtained by grounding port P0′. The function having complex zeros on the $j\omega$ axis and separately positioned complex poles is realized by splitting R2 or R2′ of FIGS. 1, 3 and 4, in accordance with the equivalence as illustrated in FIG. 2B. Usually the component-independent pass band unity gain is an advantage, but by splitting C1 this feature can be overcome with a higher grain. Also, it is not a limit that the circuit must operate on a single input. For example, let there be three signals, i.e., $IN_{low}$, $IN_{band}$, and $IN_{high}$ which it is desired to low pass, band pass, and high pass, respectively, and then to mix the signals such that the following relationship will apply;

$$OUT = \frac{1}{s^2 + 2s + 1} \cdot IN_{low} + \frac{2s}{s^2 + 2s + 1} \cdot IN_{med} + \tag{15}$$

-continued $$\frac{s^2}{s^2 + 2s + 1} \cdot IN_{high}$$

In integral form this equation becomes:

$$OUT = IN_{high} + 2\int IN_{band}dt - 2\int OUT\, dt + \int\int IN_{low}dt^2 - \int\int OUT\, dt^2 \tag{16}$$

The function is expressed as the sum of integrals, and therefore it is realized with a single stage of the circuit form of the present invention.

Figure 5:
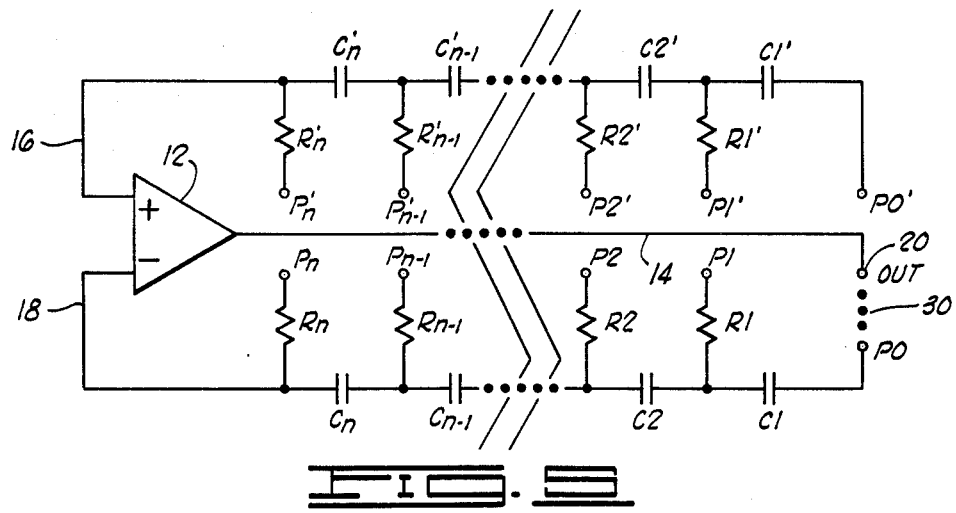
FIG. 5 depicts the most general form of the invention schematically and includes an arbitrary number of stages.

The circuit form of FIG. 1 is effectively a two stage specification of the general form as illustrated in FIG. 5 which may be comprised of an arbitrary number of stages and, as denoted by dotted line 30 between OUT and port PO, some, but not necessarily all, of the input to port PO is from OUT. Each stage allows the realization of an additional pole and an additional zero. Although there is no theoretical limit, the number of stages is eventually limited practically by loading and stability considerations. As before, the impedance connected to any input port may be replaced by the Thevenin equivalents thereof, as illustrated in FIG. 2B. The ladder form of this network is well suited to microcircuit production.

Referring further to FIG. 5, for the case where any $0 \leq m \leq n$, port $P_m$ is used to primarily generate the mth integral, and port $P_m'$ the complementary minus mth integral. For m greater than one, the use of the port $P_m$ or $P_m'$ will also result in residual lower order integrals. For $m$ less than $n$, the total mth integral in the system is thus the summation of the residual effects of all higher order inputs in addition to the primary input effect of port $P_m$ and $P_m'$. The input gains to the complementary inputs $P_m$ and $P_m'$ therefore must be chosen to balance the total mth integral of each signal in the system, such as OUT, IN, etc., such that it is the proper amount for the function being realized. These gains are controlled by component values and the impedance splitting ratios as discussed earlier.

Assuming the situation where R1/R1' equals R2/R2' equals — equals $R_n/R_n'$ equals C1'/C1 equals C1'/C2 equals — equals $C_n'/C_n$ equals K, and that port PO is connected to OUT, the functions already derived to describe the effects from ports PO' P1, P1', P2 and P2' of the second order network remain valid for the general order network, and similarly for higher order ports. Also, the prime and unprimed ports differ in effect only by a sign inversion. By way of example, the effect from port 13 is given as:

transmission at the origin of the complex plane. Similarly, from some mth port Pm to the inverting input, there are $(n-m)$ zeros at the origin. Thus, between the mth port Pm and the output connected to the port PO there are relatively m poles at the origin of the complex plane. The R-C cascaded section shown in FIG. 5 provides the simplest, but by no means the only, network with n ports and output in relation which possesses this property.

Figure 6:
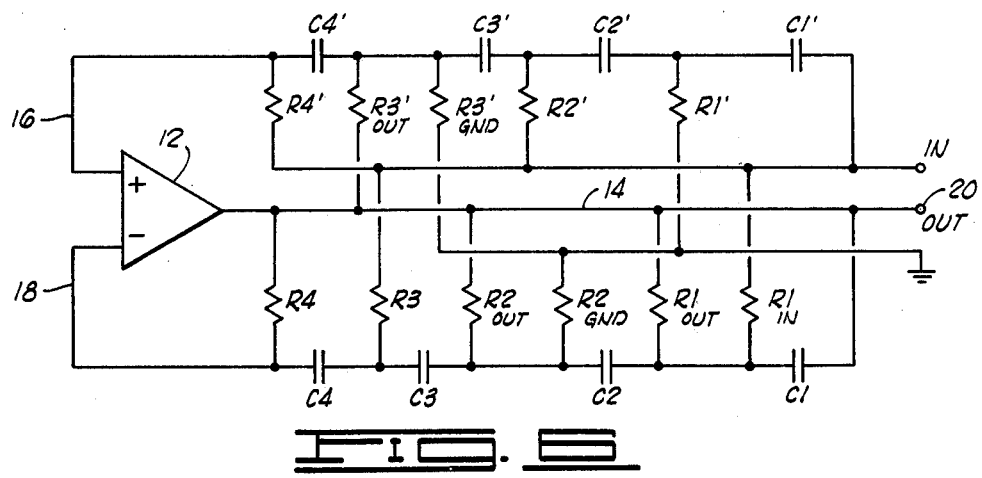
FIG. 6 is a schematic diagram of a four stage circuit which is connected to realize a fourth order all pass complex root delay network.

A starting point for finding a working combination of component values is to set C1 equal to C2 equals — equal to $C_n$ and let R2/R1 equal to R3/R2 equal to — equal to $R_n/R_{n-1}$ equal to $\delta$, where $\delta$ is a design constant. The larger the value of $\delta$, the less is the relative residual magnitude of lower order integrals compared to the primary integral effect from each port. The equality of capacitors makes it easier to obtain close tolerance between capacitors in microcircuit form. By way of physical embodiment, FIG. 6 illustrates in schematic form a fourth order all pass unity gain delay circuit with all eight roots being complex. Because this circuit contains only one directly output amplifier 12, there is no problem with scaling to prevent overranging of internal amplifiers, and the direct output results in a nearly zero output impedance to eliminate the problem of terminating with a correct load impedance. This circuit is presented as a practical example of the circuit form of FIG. 5, though it is not intended as a limitation to that basic scheme. With respect to the FIG. 6 circuit, all capacitors are selected as 0.015 microfarads multiplied by the desired delay in milliseconds, and the resistors are as follows:

$R1_{in} = 2.6$ K
$R1_{out} = 8.2$ K
$R1' = 2.0$ K
$R2_{out} = 24.$ K
$R2_{gnd} = 8.2$ K
$R2' = 6.2$ K
$R3 = 16.$ K
$R3_{out}' = 56.$ K
$R3_{gnd}' = 22.$ K
$R4 = 75.$ K
$R4' = 75.$ K For a function with all poles in the left half part of the complex plane, all denominator coefficients of $s^m$ will be positive, such that a circuit of the general form of FIG. 5 can always be found such that no part of OUT is contained in the signal to any of the primed ports. The purpose of the primed ports is to obtain an effect of complementary sign to the unprimed ports; however, if the remaining signal IN is available in complementary $$OUT = \frac{1}{R1 \cdot R2 \cdot R3 \cdot C1 \cdot C2 \cdot C3} \int\int\int P3'dt^3 \tag{17}$$

$$+ \left[ \frac{1}{R2 \cdot R3 \cdot C2 \cdot C3} + \frac{1}{R2 \cdot R3 \cdot C1 \cdot C3} + \frac{1}{R1 \cdot R3 \cdot C1 \cdot C3} + \frac{1}{R1 \cdot R3 \cdot C1 \cdot C2} \right] \int\int P3'dt^2$$

$$+ \left[ \frac{1}{R3 \cdot C3} + \frac{1}{R3 \cdot C2} + \frac{1}{R3 \cdot C1} \right] \int P3'dt$$

The similar series progression will adhere for additional ports and their higher order networks.

The underlying operation of this circuit form is explained with reference to FIG. 5. Because of the number $n$ of R/C stages between the port PO and the inverting input lead 18 of the op-amp there are n zeros of sign form of plus IN and minus IN, then all integrals of both signs may be obtained by connecting plus IN and minus IN to only the unprimed ports. All of the primed ports are then grounded, and the whole top section (primed R-C network of FIG. 5) may be removed thereby reducing the number of capacitors to a theoretical minimum. The plus input 16 to op-amp 12 is then directly grounded.

Figure 7:
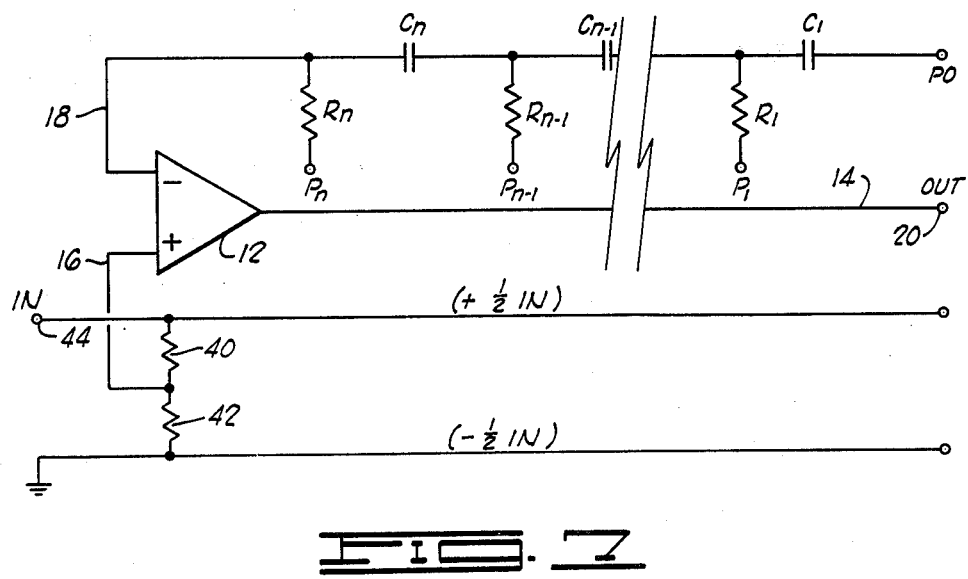
FIG. 7 is a schematic diagram of the general form circuit connected to realize a pseudo-ground relationship.

Referring now to FIG. 7, it is shown that instead of generating a compound of IN, there can be defined a pseudo-ground which is a fraction of IN, and which will be taken for matters of simplicity and not limitation to be one-half. The pseudo-ground is presented to the plus input 16 as derived from a voltage divider consisting of resistors 40 and 42 series-connected between ground and a selected IN voltage reference input 44. Relative to the pseudo-ground, IN appears to be pseudo-½·IN and real ground appears to be pseudo·(-minus ½)·IN. Relative to the pseudo-ground there are now complementary sign IN signals, and using the method of the present invention, the unprimed branch of the circuit form (FIG. 5) may be used to generate any transfer function desired relative to the pseudo-ground. In this case, there is generated relative to pseudo-ground the function $$\text{OUT} = [G(s) - \tfrac{1}{2}]\cdot\text{IN} \qquad (18)$$

which relative to the true ground is exactly $G(s)$.

The specialized minimum form as represented in FIG. 7 is theoretically capable of realizing any non-oscillatory transfer function by using only a single operational amplifier along with a theoretical minimum number of non-resistive elements. However, in using this form it is required that a circuit be found which requires no inversion of OUT when using only the unprimed ports, and this situation often in unreasonable resistor ratios. Even in the second order case, where this is not a problem, the required total capacitance in the circuit is usually not reduced because the effecting input signal voltage has been halved, thus requiring one-quarter the impedance for equivalent noise, and also because the lack of impedance symmetry poses biasing, coupling noise, and distortion problems which also require lowered impedance for equivalent signal quality.

The foregoing discloses a novel method and circuit which utilizes but a single operational amplifier to perform an active filter circuit which is capable of realizing any general order linear transfer function. The basic circuit form is variable in any of a multitude of interconnections to provide a desired filter function stage as may be required by the exigencies of the particular application. Use of the present method and circuit stages designed in accordance therewith provide extremely great versatility as the basic circuit form can perform any of numerous circuit functions, all of which are within the skilled designer's capability.

Changes may be made in the combination and arrangement of steps and/or elements as heretofore set forth in the specification and shown in the drawings; it being understood that changes may be made in the embodiments disclosed without departing from the spirit and scope of the invention as defined in the following claims.

What is claimed is:

1. An active resistance-capacitance filter circuit comprising:
   input and ground terminals; an operational amplifier having an output and positive and negative inputs; and
   first and second resistance-capacitance networks each connected to the respective positive and negative inputs of the operational amplifier and each consisting of plural series-connected capacitors and interstitially parallel-connected resistors wherein the extremity terminals of each resistor and finally connected capacitor constitute a port, and wherein selected ports are selectively connectable to input and ground terminals and the operational amplifier output to provide a desired linear transfer function at the output of said operational amplifier.

2. An active filter circuit as set forth in claim 1 wherein:
   respective resistor conductance values and capacitor capacitance values of the first and second resistance-capacitance networks are directly proportionate to an impedance scaling factor.

3. An active filter circuit as set forth in claim 1 which is further characterized in that:
   the extremity circuit element of at least one selected port having given impedance may be parallel split into a plurality of components having in parallel combination equal impedance to the original unsplit circuit element.

4. An active filter circuit as set forth in claim 2 which is further characterized in that:
   the extremity circuit element of at least one selected port having given impendace may be parallel split into a plurality of components having in parallel combination equal impedance to the original unsplit circuit element.

5. An active resistance-capacitance filter circuit comprising:
   an operational amplifier having an output and positive and negative inputs;
   a first network consisting of a first resistance connected in parallel with series-connected first and second capacitors, said first network being connected between the amplifier output and negative input;
   a circuit input terminal;
   a second resistance connected between said circuit input terminal and the connection of said first and second capacitors;
   a second network consisting of a third resistance connected in parallel with series-connected third and fourth capacitors, said second network being connected between the circuit input terminal and positive input; and
   a fourth resistance connected between circuit common and the connection of said third and fourth capacitors.

6. An active filter circuit as set forth in claim 5 which is further characterized to include:
   a fifth resistor connected between said circuit common and the connection of said first and second capacitors.

7. An active filter circuit comprising:
   signal output and ground terminals;
   an operational amplifier having an output and positive and negative inputs;
   a resistance-capacitance network connected to the negative input of the operational amplifier consisting of a plurality of at least three series-connected capacitors and interstitially connected resistors wherein the extremity terminals of each resistor and finally connected capacitor constitute a port; and
   a voltage divider connected between signal input and ground, outputting to the positive input of the operational amplifier, wherein selected ports are selectively connectable to input and ground terminals and the operational amplifier output to provide a desired linear transfer function at the output of said operational amplifier.

8. An active filter as set forth in claim 7 which is further characterized in that:
the extremity circuit element of at least one selected port having given impedance may be parallel split into a plurality of components having in parallel combination equal impedance to the original unsplit circuit element.

9. A method of generating linear transfer functions utilizing a single operational amplifier having an output and positive and negative inputs, comprising:
connecting first and second R-C networks to respective positive and negative inputs, each network consisting of plural series-connected capacitors and interstitially parallel-connected resistors with the extremity terminals of each resistor and the finally connected capacitor of each network constituting a port; and
selectively interconnecting ports between amplifier output, ground and one or more signal inputs to synthesize a selected one of a plurality of linear transfer functions.

10. A method of generating linear transfer functions as in claim 9 which further allows at least one selected port to be effectively connected to a combination of amplifier output, ground and at least one signal input by splitting the extremity circuit element of the port into a plurality of parallel impedances, each terminally selectively connected to the amplifier output, and ground, and at least one signal input, and having in parallel combination and impedance equal to the original unsplit circuit element.

11. A fourth order all pass unity gain delay circuit, comprising:
an operational amplifier having positive and negative inputs and an output;
a circuit input connected through a first resistance to the operational amplifier positive input;
first, second, third and fourth series-connected capacitances connected between the circuit input and the operational amplifier positive input;
a second resistance connected between common and the first and second capacitance junction;
a third resistance connected between the circuit input and the second and third capacitance junction;
a fourth resistance connected between common and the third and fourth capacitance junction;
a fifth resistance connected between the operational amplfier output and the third and fourth capacitance junction;
fifth, sixth, seventh and eighth series-connected capacitances connected between the operational amplifier output and negative input;
a sixth resistance connected between circuit input and the fifth and sixth capacitance junction;
a seventh resistance connected between the operational amplifier output and the fifth and sixth capacitance junctions;
an eight resistance connected between common and the sixth and seventh capacitance junction;
a ninth resistance connected between the operational amplifier output and the sixth and seventh capacitance junction;
a tenth resistance connected between the circuit input and the seventh and eight capacitance junction; and
an eleventh resistance connected between the operational amplifier output and negative input.

* * * * *

UNITED STATES PATENT OFFICE

CERTIFICATE OF CORRECTION

Patent No. 4,050,023  Dated September 20, 1977

Inventor(s) Albert D. Edgar

It is certified that error appears in the above-identified patent and that said Letters Patent are hereby corrected as shown below:

Column 1:

-line 10, insert --and-- after "networks,";

-line 15, change "fractorable" to -- factorable--;

-line 17, change "2S" to --$\alpha$s--;

-line 55, change "hybride" to --hybrid--;

-line 59, change "wellknown" to --well-known--;

Column 2:

-line 25, change "FIG" to --FIGS.--;

-line 25, change "illustrates" to --illustrate--;

-line 56, delete "port";

Column 3:

-line 29, change "out" to --OUT--;

-line 35, change "$\frac{1}{R1 \cdot C1}$" to -- - $\frac{1}{R1 \cdot C1}$ --;

-line 36, change "6" to --16--;

UNITED STATES PATENT OFFICE
CERTIFICATE OF CORRECTION

Patent No. 4,050,023                    Dated September 20, 1977

Inventor(s)    Albert D. Edgar

It is certified that error appears in the above-identified patent and that said Letters Patent are hereby corrected as shown below:

Column 3 (cont'd)

-line 37, change "out" to --OUT--;

Column 4:

-line 15, change "1/C1" to -- $\frac{1}{C1}$ --;

-line 28, change "out" to --OUT--;

-line 38, change "9-transformed" to --9-inverted--;

-line 38, change "inverted" to --transformed--;

-line 47, change " $\frac{1}{R2'\cdot C2'}$ " to -- $\frac{1}{R2'\cdot C1'}$ --;

-line 52, change "R2/R'" to --R2/R2'--;

-line 53, change "C2'C2" to --C2'/C2--;

-line 61, change "K=" to --$K_n$=--;

-line 61, change "$\leq$ m $\leq$" to --$\leq$ m $\leq$--;

UNITED STATES PATENT OFFICE
CERTIFICATE OF CORRECTION

Patent No. 4,050,023  Dated September 20, 1977

Inventor(s) Albert D. Edgar

It is certified that error appears in the above-identified patent and that said Letters Patent are hereby corrected as shown below:

Column 5:

- line 11, (Equation 11) change "$\gamma s^2$" to --$\check{\gamma} s^2$--;

- line 16, (Equation 12) change "$\gamma$" to --$\check{\gamma}$--;

- line 16, (Equation 12) insert -- - -- after "$\alpha´\int INdt$";

- line 16, (Equation 12) change "$´\alpha\int OUTdt$" to --$\alpha\int OUTdt$--;

- line 39, change "noninverting" to --non-inverting--;

- line 44, insert --;-- after "included";

Column 6:

- line 35, change "$(G) = \frac{\alpha(\alpha+\alpha´)}{2\beta}$" to --$R2´K = R2 = \frac{2}{\alpha \cdot C1}$--;

- line 37, change "$R2´K = R2 = \frac{2}{\alpha \cdot C1}$" to --$(G) = \frac{\alpha(\alpha+\alpha´)}{2\beta}$--;

Column 7:

- line 11, change "realized" to --realizable--;

- line 28, change "$\leqq m \leqq$" to --$\leq m \leq$--;

- line 51, change "13" to --P3--;

UNITED STATES PATENT OFFICE
CERTIFICATE OF CORRECTION

Patent No. 4,050,023  Dated September 20, 1977

Inventor(s) Albert D. Edgar

It is certified that error appears in the above-identified patent and that said Letters Patent are hereby corrected as shown below:

Column 8:

-line 11, change "equals" to --equal--;

-line 30, change "0.015" to -- .015 --;

Column 9:

-line 5, change "compound" to --complement--;

-line 8, insert --(1/2).-- after "half";

-line 22, (Equation 18) insert -- ] -- after "1/2";

-line 32, insert --results-- after "often";

-line 35, change "effecting" to --effective--.

Signed and Sealed this

Fourteenth Day of February 1978

[SEAL]

Attest:

RUTH C. MASON  
Attesting Officer

LUTRELLE F. PARKER  
Acting Commissioner of Patents and Trademarks